United States Patent
Wood et al.

(10) Patent No.: US 7,075,337 B2
(45) Date of Patent: Jul. 11, 2006

(54) SINGLE EVENT UPSET IMMUNE KEEPER CIRCUIT AND METHOD FOR DUAL REDUNDANT DYNAMIC LOGIC

(75) Inventors: Neil Edward Wood, Centreville, VA (US); Devin Bayles, Manassas, VA (US)

(73) Assignee: BAE SYSTEMS Information and Electronic Systems Integration, Inc., Nashua, NH (US)

( * ) Notice: Subject to any disclaimer, the term of this patent is extended or adjusted under 35 U.S.C. 154(b) by 41 days.

(21) Appl. No.: 10/882,929

(22) Filed: Jun. 30, 2004

(65) Prior Publication Data

US 2006/0001442 A1    Jan. 5, 2006

(51) Int. Cl.
*H03K 19/094* (2006.01)
(52) U.S. Cl. ......................................... 326/95; 326/121
(58) Field of Classification Search ................... 326/95, 326/98, 121
See application file for complete search history.

(56) References Cited

U.S. PATENT DOCUMENTS

| 5,382,844 A | * | 1/1995 | Knauer | 326/95 |
| 6,046,606 A | * | 4/2000 | Chu et al. | 326/95 |
| 6,282,140 B1 | | 8/2001 | Phan et al. | 365/230.02 |
| 6,696,874 B1 | | 2/2004 | Wood | 327/210 |

\* cited by examiner

*Primary Examiner*—Daniel Chang
(74) *Attorney, Agent, or Firm*—Daniel J. Long; Graybeal Jackson Haley

(57) ABSTRACT

A method includes precharging a first dynamic node, precharging a second dynamic node, and maintaining a first logic state of a signal on the first dynamic node responsive to a second logic state of a signal on the second dynamic node. The method further includes maintaining the second logic state of the signal on the second dynamic node responsive to the first logic state of the signal on the first dynamic node.

20 Claims, 4 Drawing Sheets

SINGLE EVENT UPSET IMMUNE KEEPER CIRCUIT AND METHOD FOR DUAL REDUNDANT DYNAMIC LOGIC

The invention was made with United States Government support under Contract No. 03-C-0216. The United States Government has certain rights in this invention.

TECHNICAL FIELD

The present invention relates generally to integrated circuits that operate in environments where radiation-induced logic errors may occur.

BACKGROUND OF THE INVENTION

Integrated circuits are operated in environments where radiation-induced logic errors may occur, such as in outer space. In such environments, the integrated circuit is required to maintain data integrity during a single event upset. A single event upset is a radiation-induced error in the logic state of a signal within the integrated circuit. The logic error may be the result of a collision between a high-energy proton or a heavy ion (cosmic ray) and the semiconductor material that forms the integrated circuit. Such a collision produces a quantity of electron-hole pairs in circuitry within the integrated circuit that is generating the signal, with the quantity of electron-hole pairs being capable of altering the logic state of the signal.

To prevent single event upsets from causing erroneous operation of the integrated circuit, circuitry within the integrated circuit must be designed to withstand such upsets. As a result, static logic circuitry is typically used in place of dynamic logic circuitry to protect against single event upsets. While static logic circuitry protects against single event upsets, static logic circuitry is slower than dynamic logic circuitry and thus overall performance of the integrated circuit is adversely affected. With dynamic logic circuitry, a precharge node is charged or "precharged" to a voltage corresponding to a certain logic state (e.g., high) during a precharge cycle. After the precharge cycle an input signal is evaluated and results either in the node remaining at its precharged logic state or being driven to the complementary logic state (e.g., low). A transition period corresponds to the time between when the node is precharged and when the input signal is evaluated, and during this time the node may not be driven by any component but instead is "floating." As a result, the node is susceptible to a single event upset during this time, and such a single event upset may result in erroneous evaluation of the input signal during the subsequent evaluation period.

Various approaches have been utilized to protect against single event upsets in dynamic logic circuitry. One approach utilizes a keeper circuit that utilizes a pull-up transistor to maintain the precharge node at a desired logic level during the transition period. With this approach, the keeper circuit includes an inverter coupled between the precharge node an output node, with a pull-up PMOS transistor being coupled between a supply voltage source and the precharge node and a gate of the transistor being coupled to the output node. When the precharge node is precharged high, the inverter drives the output node low to thereby turn ON the PMOS transistor and maintain the precharge node high even after the node is done being precharged. Such a keeper circuit is not immune against single event upsets, however, since a single event upset on either the precharge node or the output node of the inverter can cause the circuit to change states. For example, assume the node is precharge high with the inverter output low and the PMOS transistor turned ON to maintain the node high. A single event upset on the precharge node, for example, may drive the precharge node sufficiently low to cause the inverter to drive its output high. When the output of the inverter goes high, the PMOS transistor turns OFF so that the precharge node remains low. The circuit has at this point erroneously changed state in response to the single event upset.

Another approach utilizes dual data paths, each including a precharge node coupled to a data keeper circuit. Dual inputs are applied, one to each data path, and each input drives the corresponding precharge node to a particular logic state. In response to a signal level on each precharge node, an output from each data path is fed back an applied to the precharge node to maintain the node at the proper logic state (i.e., either high or low). Each output is generated responsive to the logic state on the corresponding precharge node. Moreover, in one approach if the logic states on the precharge nodes differ then the data keeper circuit maintains each output at its current state, thereby inhibiting the signal on each precharge node from propagating to the outputs. In this way the data keeper circuit generates the outputs only when valid data is applied to both inputs. The dual data paths in this type of circuit drive the precharge nodes either high or low to ensure these nodes are maintained at a desired voltage level. Circuitry coupled to the precharge nodes to ensure the nodes are maintained either high or low increases the capacitance of these nodes and thereby increases the overall power consumption of the circuit since more charge must be supplied to drive the nodes to the desired voltage level. The dual data paths do, however, prevent a single event upset on any node in the circuit from erroneously changing the state of the circuit, as will be appreciated by those skilled in the art. While conventional data keeper circuits prevent single event upsets, these circuits require additional components and thus increase the overall size and power consumption of the circuitry being formed in the integrated circuit.

There is a need for a circuit and method of preventing single event upsets in dynamic logic circuitry while reducing the size and power consumption of the circuitry.

SUMMARY OF THE INVENTION

According to one aspect of the present invention, a method includes precharging a first dynamic node, precharging a second dynamic node, and maintaining a first logic state of a signal on the first dynamic node responsive to a second logic state of a signal on the second dynamic node. The method further includes maintaining the second logic state of the signal on the second dynamic node responsive to the first logic state of the signal on the first dynamic node.

DETAILED DESCRIPTION OF THE INVENTION

Figure 1:
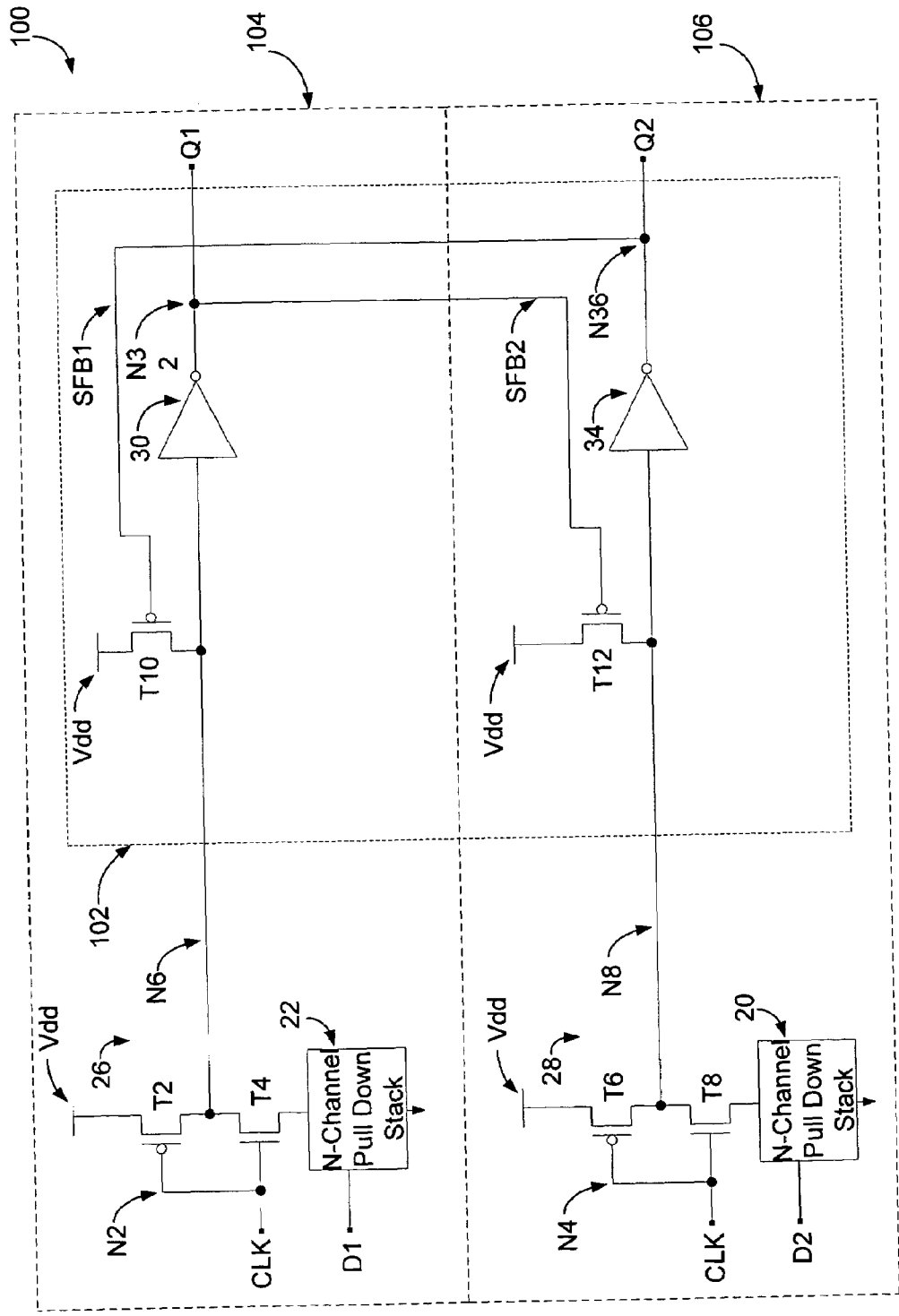
FIG. 1 is a schematic of a single event upset immune circuit including a single event upset immune keeper circuit according to one embodiment of the present invention.

FIG. 1 illustrates a single event upset (SEU) immune circuit 100 including an SEU keeper circuit 102 according to one embodiment of the present invention. The SEU immune circuit 100 includes a first logic path 104 having a first data input D1 and a first data output Q1 and a second logic path 106 having a second data input D2 and a second data output Q2. The first logic path 104 receives the second data output Q2 on a first self-feedback loop SFB1 and the second logic path 106 receives the first data output Q1 on a second self-feedback loop SFB2. The self-feedback loops SFB1 and SFB2 in the SEU keeper circuit 102 operate in combination to maintain a first precharge node N6 and a second precharge node N8 at high logic states during the transition time between precharge of these nodes and evaluation of the data inputs D1 and D2, as will be explained in more detail below. The SEU keeper circuit 102 contains fewer components than conventional keeper circuits since the nodes N6, N8 are only maintained high in the case of a single event upset, reducing the number of components required to implement the keeper circuit and thereby reducing the overall size of the circuit. Moreover, since fewer components are coupled to the precharge nodes N6 and N8 the capacitances of these nodes is lower, which reduces the overall power consumption of the SEU keeper circuit 102.

The first logic path 104 further includes a driver circuit 26 connected between a power source Vdd and an N-channel transistor stack 22 that is also coupled to ground or other reference voltage source. The driver circuit 26 includes transistors T2 and T4, which are connected in series such that the respective gates form a clock input CLK and drains form the first precharge node N6. A first portion of the SEU keeper circuit 102 is included in the first logic path 104. This portion includes a transistor T10 connected between the power source Vdd and the dynamic node N6. An input of an inverter 30 is also coupled to the precharge node N6, with the output of the inverter generating an output Q1 in response to a signal on the precharge node. A second portion of the SEU keeper circuit 102 is included in the second logic path 106, which includes a transistor T12, and an inverter 34 coupled in the same as just described for the first logic path 104. The inverter 34 generates an output Q2 in response to a signal on the precharge node N8. In the first logic path 104, a gate of the transistor T10 is connected through the self-feedback loop SFB1 to the output Q2 of the inverter 34. Similarly, in the second logic path 106 a gate of the transistor T12 is connected through the self-feedback loop SFB2 to the output Q1 of the inverter 30. The second logic path 106 further includes a driver circuit 28 connected between the power source Vdd and an N-channel transistor stack 20 that is also coupled to ground or other reference voltage source. The driver circuit 28 includes transistors T6 and T8, which are connected in series such that the respective gates form a clock input CLK and drains form the precharge node N8.

In operation, the SEU immune circuit 100 operates in two modes, a precharge mode and an evaluation mode. During the precharge mode, the clock input CLK is low, turning ON the transistors T2 and T6 and turning OFF the transistors T4 and T8. With the transistors T4 and T8 turned OFF, the precharge nodes N6 and N8 are isolated from the N-channel transistor stacks 22 and 20 so that the state of the data inputs D1 and D2 do not affect the operation of the circuit 100 in this mode. In response to the transistor T2 being turned ON, the precharge node N6 is driven high or "precharged." Similarly, in response to the transistor T6 being turned ON the precharge node N8 is precharged. With the nodes N6 and N8 precharged high, the respective inverters 30 and 34 drive the outputs Q1 and Q2 low. The low Q1 and Q2 outputs are applied via the self-feedback loops SFB1 and SFB2 to the transistors T10 and T12, turning on these transistors thereby drive the respective precharge nodes high through the corresponding transistor. At this point, the CLK input goes high to terminate the precharge mode of operation. When the CLK input goes high, the transistors T2 and T6 turn OFF so that these transistors no longer drive the precharge nodes N6 and N8 high. The transistors T10 and T12, however, continue driving the nodes N6 and N8 high at this point. Also, in response to the high CLK input the transistors T4 and T8 turn ON, coupling the N-channel stacks 22 and 24 to the nodes N6 and N8, respectively.

The evaluation mode of operation starts when the clock input CLK goes high and the data inputs D1 and D2 to be evaluated are applied to their respective N-channel transistors stacks 22 and 20. When the CLK input goes high, transistors T2 and T6 turn OFF and transistors T4 and T8 turn ON, coupling the precharge nodes N6 and N8 to the transistor stacks 22 and 20, respectively. At this point, each of the precharge nodes N6 and N8 acquires the complement of the logic state of the corresponding data input D1 and D2. For example, if the input D1 is high the transistor stack 22 turns ON, coupling the precharge node N6 to ground (i.e., low) through the transistor T4 and the transistor stack. Thus, in response to the high input D1 the precharge node N6 is driven low. In response to the low signal on the node N6, the inverter 30 drives the output Q1 high, turning OFF transistor T10 to allow the node N6 to be maintained low through the transistor T4 and stack 22. The sizes of the transistors 22, T4, and T10 are selected to allow the node N6 to be pulled low and thereby cause the inverter 30 to drive the output Q1 high, as will be appreciated by those skilled in the art. Conversely, if the input D1 is low the transistor stack 22 remains turned OFF and the precharge node N6 remains high, which was its precharged state. The operation of the second logic path 106 is identical in response to the input D2 is identical to the operation just described for the first logic path 104, and thus, for the sake of brevity, will not be described in more detail.

During operation of the SEU immune circuit 100, a transition period exists between the termination of the precharge mode when the CLK input goes low and the application of the data inputs D1 and D2. As previously described, during this time a single event upset can occur from a collision of an energetic proton or fast charged particle at either precharge node N6 or N8. The collision may cause an increase in electron-hole pairs (carriers) and possibly alter the logic state of one of the precharge nodes N6 and N8. With the SEU keeper circuit 102, however, the self-feedback loops SFB1 and SFB2 prevent such a single event upset from occurring on the precharge nodes N6 and N8. This is true because if either of the nodes N6 or N8 begins to go low in response to the collision of a high energy particle the node is maintained at its prior level. For example, assume the precharge nodes N6 and N8 are precharged high and the inverters 30 and 34 therefore drive their respective outputs Q1 and Q2 low. At this point, the transistors T10 and T12 are turned ON responsive to the low outputs Q1 and Q2 and maintain the nodes N6 and N8 high. In the event of a single event upset on node N6, for example, which causes the node to begin going low, the inverter 34 maintains output Q2 low to keep the transistor T10 turned ON. The turned ON transistor T10 supplies charge to the node N6 to maintain or return the node high even when a single event upset on that node would otherwise cause the node to go low. The transistors T10 and T12 do this for their corresponding precharge nodes N6 and N8 by supplying to the nodes a quantity of charge carriers sufficient to maintain the high logic state at the node. Note that if the node N6 temporarily goes low enough to cause the inverter 30 to drive the output Q1 high, this does not affect node N8 since T12 would simply momentarily turn OFF in response to the low output Q1. The operation of the circuit 100 is the same with regards to the precharge node N8.

The SEU immune circuit 100 includes only the singe transistors T10 and T12 coupled to these nodes for maintaining the nodes precharged high. As a result, the capacitance of the nodes N6 and N8 is reduced when compared to conventional circuits that include additional components for driving the nodes low to maintain the nodes at their desired voltage levels. As a result, the power consumption of the circuit 100 is reduced since less charge must be supplied and removed from the nodes N6 and N8 to drive the nodes to the desired voltage levels. This also reduces the number of components in the SEU immune circuit 100 and thereby reduces the layout area and cost of the circuit.

Figure 2:
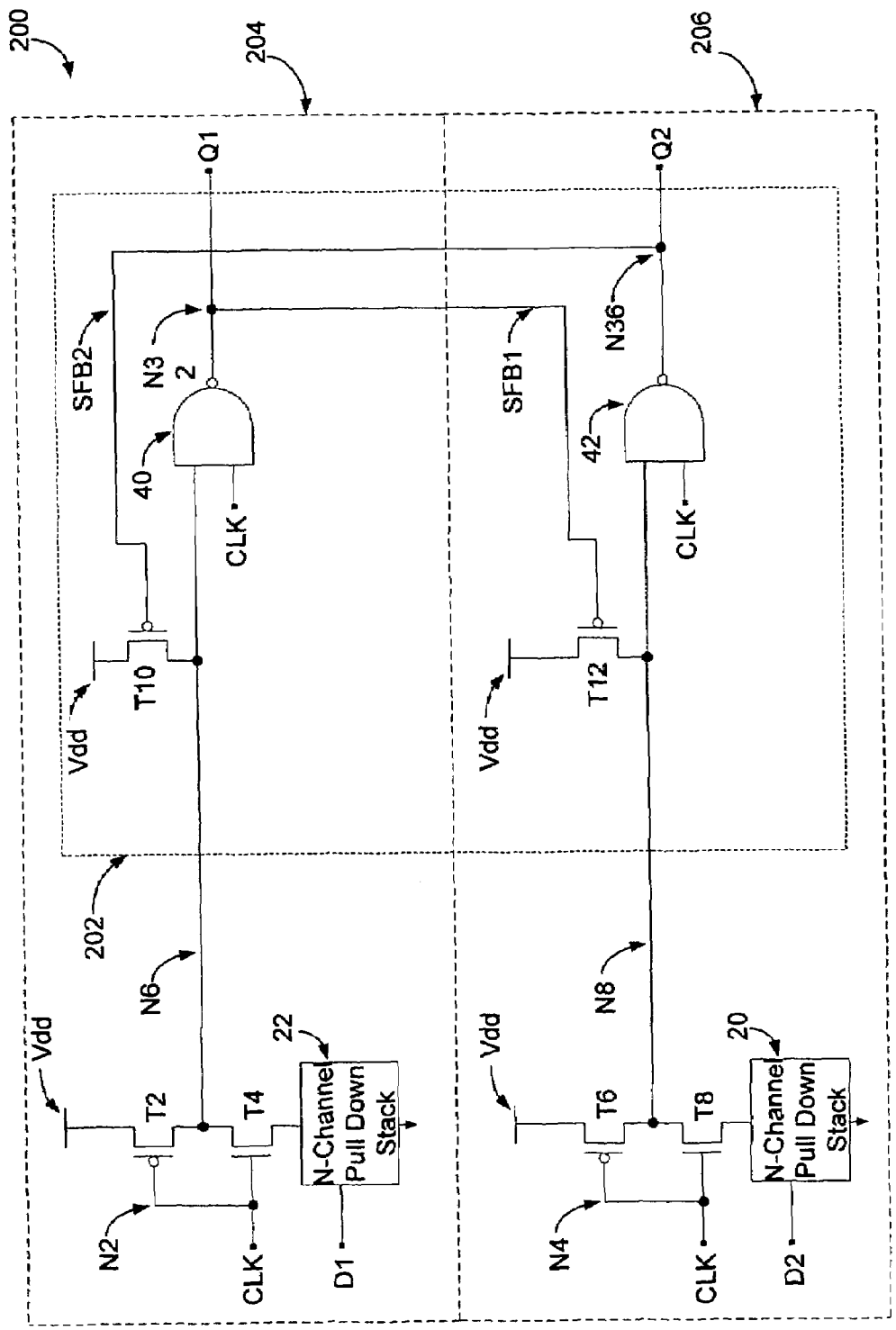
FIG. 2 is a schematic of a single event upset immune circuit including a single event upset immune keeper circuit having reduced power consumption according to another embodiment of the present invention.

FIG. 2 is a schematic of an SEU immune circuit 200 including an SEU keeper circuit 202 having reduced power consumption according to another embodiment of the present invention. In the embodiment of FIG. 2, the SEU keeper circuit 202 includes NAND gates 40 and 42 in place of the inverters 30 and 34, respectively, in the keeper circuit 102 of FIG. 1. The other components and signals of the SEU immune circuit 200 and keeper circuit 202 are identical to the circuits 100 and 102 of FIG. 1 and thus will not again be described in detail. Each of the NAND gates 40 and 42 includes a first input coupled to the corresponding precharge node N6 and N8 and receives the CLK input on a second input.

In operation, the SEU immune circuit 200 operates in a precharge and evaluation mode in much the same way as previously described for the SEU immune circuit 100 of FIG. 1 and thus only the differences in operation will now be described. The CLK input is once again low during the precharge mode and high during the evaluation mode. During the precharge mode the CLK input is low, disabling the NAND gates 40 and 42 which, in turn, drive the outputs Q1 and Q2 high. In response to the high output from the NAND gates 40 and 42, the transistors T10 and T12 are turned OFF during the precharge mode such that the precharge nodes N6 and N8 are precharged only through the transistors T2 and T6.

Prior to the CLK signal going high, in the circuit 200 the data inputs D1 and D2 are applied to the stacks 22 and 20. At this point, assuming the inputs D1 and D2 are high, the nodes N6 and N8 begin going low through the stacks 22 and 20. When the CLK signal goes high, this terminates operation of the precharge mode and commences operation in the evaluation mode. In response to the CLK signal going high, the NAND gates 40 and 42 begin driving the corresponding outputs Q1 and Q2 low since each gate now receives two high inputs, assuming the corresponding precharge node N6 and N8 has not yet been driven low through the corresponding stack 22, 20. For each NAND gate 40 and 42 there is a delay between when the gate receives the high inputs and when the gate drives the corresponding output Q1 and Q2 low. This results in the nodes N6 and N8 being driven low through the stacks 22 and 20 before the transistors T10 and T12 are turned ON responsive to the low outputs Q1 and Q2. Because the transistors T10 and T12 are turned OFF at this point, no current or a reduced amount of current flows through these transistors when driving the nodes N6 and N8 low. This reduces the overall power consumption of the SEU immune circuit 200. In contrast, with the circuit 100 of FIG. 1 the transistors T10 and T12 are turned ON when the stacks 22 and 20 turn ON to drive the nodes N6 and N8 low. When the inputs D1 and D2 are low, the NAND gates 40 and 42 drive the outputs Q1 and Q2 low, turning ON the transistors T10 and T12 which then maintain the precharge nodes N6 and N8 high. Note the circuit 200 could also be operated in the same way as circuit 100 of FIG. 1 in that the CLK signal could go high to terminate the precharge mode prior to the data inputs D1 and D2 being applied. In this situation, however, the transistors T10 and T12 would be turned ON when the nodes N6 and N8 are being driven low which would increase the overall power consumption of the circuit 200.

Figure 3:
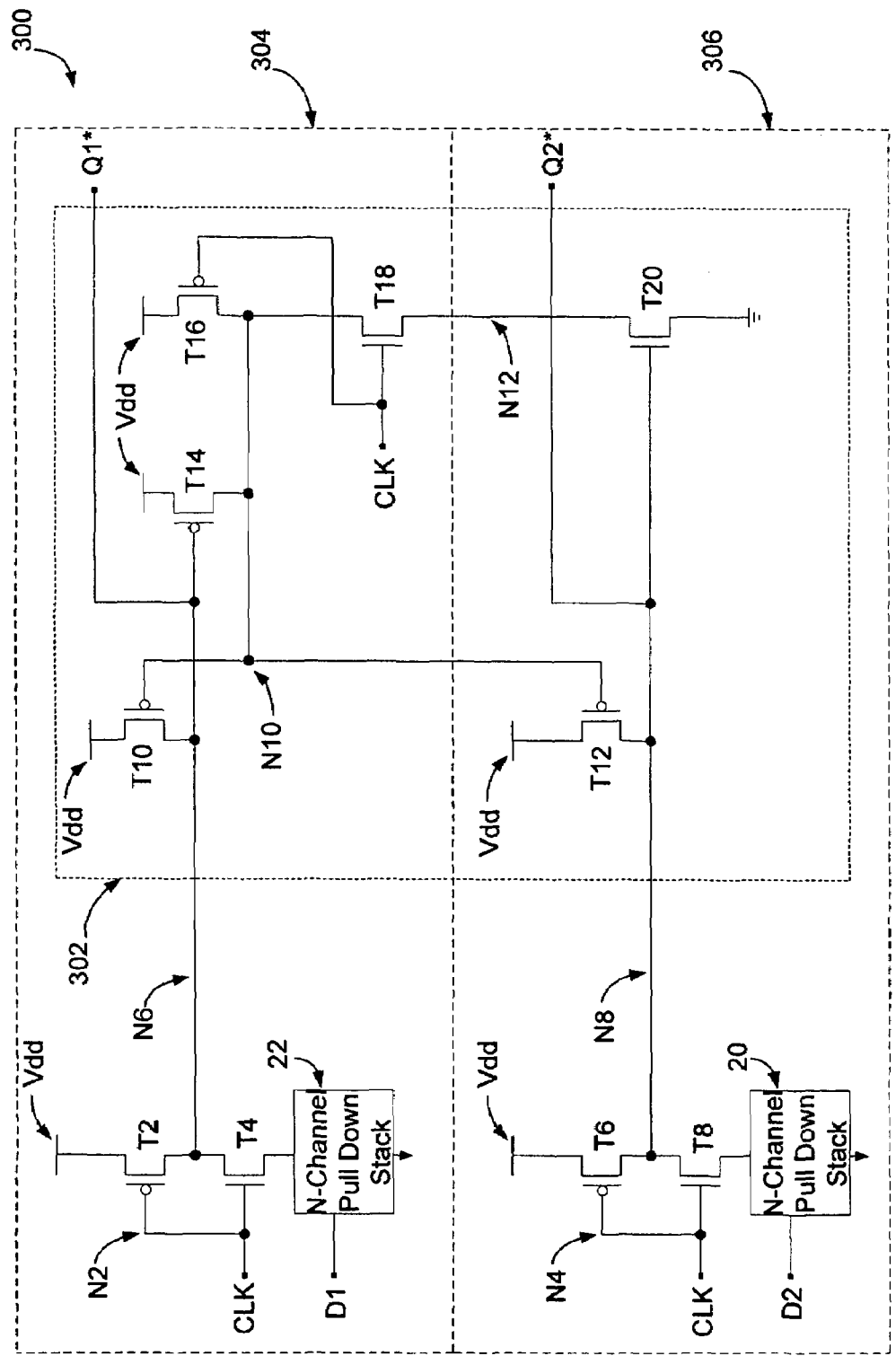
FIG. 3 is a schematic of a single event upset immune circuit including a single event upset immune keeper circuit having a reduced component structure and a reduced semiconductor integration area according to a further embodiment of the present invention.

FIG. 3 is a schematic of an SEU immune circuit 300 including an SEU keeper circuit 302 having a reduced component structure and a reduced semiconductor integration area according to a further embodiment of the present invention. Once again, for the sake of brevity, components and signals common to the SEU immune circuit 300 and the SEU immune circuit 200 of FIG. 2 have been given the same reference designations and will not again be described in detail. The SEU immune circuit 300 includes an SEU keeper circuit 302 including two PMOS transistors T14 and T16 and two NMOS transistors T18 and T20 having appropriate sizing ratios of the PMOS and NMOS transistors such that the two NAND functions performed by the NAND gates 40 and 42 of FIG. 2 are achieved with fewer components forming a single NAND structure, as will now be described in more detail. The SEU keeper circuit 302 includes PMOS transistors T10 and T12 having common gates coupled to a node N10 and being coupled between the precharge nodes N6 and N8, respectively, and the power source Vdd. The PMOS transistors T14 and T16 are connected in parallel between the power supply Vdd and the node N10, with the gate of the transistor T14 connected to the precharge node N6 and the gate of the transistor T16 receiving the clock input CLK. The NMOS transistors T18 and T20 are connected in series between the node N10 and ground with the gate of the NMOS transistor T18 connected to receive the clock input CLK and the gate of the NMOS transistor T20 connected to the precharge node N8. As previously mentioned, the size ratios of the PMOS transistors T14 and T16 and NMOS transistors T18 and T20 must be properly selected to provide proper operation of the SEU keeper circuit 302. More specifically, the NMOS transistors T18 and T20 are larger than the PMOS transistors T14 and T16 to overcome the PMOS transistors during the precharge mode of operation and during the occurrence of a single event upset, as will be explained in more detail below.

In operation during the precharge mode, the SEU keeper circuit 302 precharges the precharge nodes N6 and N8. More specifically, during the precharge mode the CLK input is low, turning on the transistors T2 and T6 to precharge the nodes N6 and N8 in the same way as previously described. Also, when the CLK input is low the transistor T16 is turned ON, driving the node N10 high and thereby turning OFF the PMOS transistors T10 and T12. The transistor T18 is also turned OFF in response to the low CLK input and transistor T20 is turned ON responsive to the high on node N8.

When the CLK input goes high, the precharge mode of operation terminates. In response to the CLK input going high, the transistors T2 and T6 turn OFF along with the transistor T16, while the transistor T18 turns ON. At this point, both the NMOS transistors T18 and T20 are turned ON, pulling node N10 low. When the node N10 goes low, the transistors T10 and T12 turn ON to drive the precharge nodes N6 and N8, respectively, high. This is the state of the circuit 300 during the transition period before the data inputs D1 and D2 to be evaluated are applied to the circuit. In the event a high energy particle results in one of the precharge nodes N6 and N8 beginning to go low, the node is maintained high by the corresponding transistor T10 or T12 to prevent a single event upset of the circuit 300.

When the data inputs D1 and D2 to be evaluated are applied to the circuit 300, the nodes N6 and N8 remain high if the inputs are low. Conversely, if the inputs D1 and D2 are high the precharge nodes N6 and N8 are driven low through the transistors T4, T8 and stacks 22, 20. When the node N8 goes low, the transistor T20 turns OFF which means the node N10 is no longer being driven low through the transistors T18 and T20. At the same time, the low node N6 turns ON the transistor T14 to thereby drive the node N10 high and turn OFF the transistors T10 and T12. In the keeper circuit 302, the precharge nodes N6 and N8 correspond to outputs Q1* and Q2*, with the "*" indicating the output is inverted relative to the corresponding inputs D1 and D2. From the above description, the outputs Q1* and Q2* are high if the inputs D1 and D2 are low and the outputs are driven low through the stacks 22 and 20 if the inputs are high. The SEU keeper circuit 302 includes fewer components than the keeper circuits 102 and 202 of FIGS. 1 and 2, respectively, thus reducing the layout area required for forming the circuit.

Figure 4:
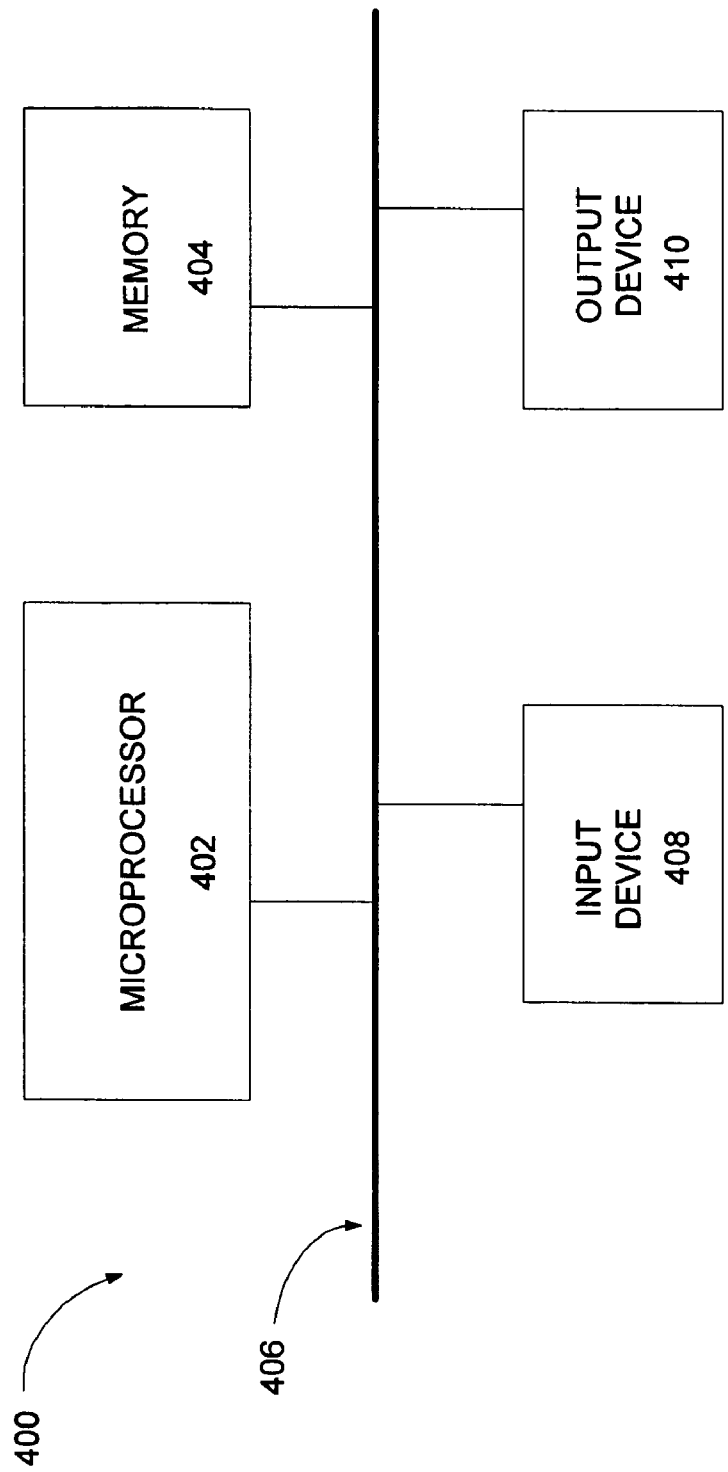
FIG. 4 is a schematic of an electronic system including one or more of the single event upset immune circuits of FIGS. 1–3 according to another embodiment of the present invention.

FIG. 4 is a schematic of an electronic system 400 including one or more of the SEU immune circuits 102, 202, and 302 of FIGS. 1–3 according to another embodiment of the present invention. The electronic system 400 includes a microprocessor 402 coupled to a memory 404 through a bus 412. Data and programs being executed by the microprocessor 402 are stored in the memory 404. Both the microprocessor 402 and the memory 404 may include one or more of the SEU immune circuits 102, 202, and 302. The electronic system 400 further includes n input devices 408 and output devices 410 coupled to the microprocessor 402 via the bus 406. Where the system 400 is a computer system, for example, the inputs devices 408 may include a keyboard and a mouse and the output devices 410 may include a printer and a video monitor. Furthermore, note that depending on the specific application of the system 400 the components 402–410 may be integrated in a single semiconductor chip or may be contained on a common carrier such as a printed circuit board. Also, depending o the application of the system 400, the SEU immune circuits 102, 202, and 302 may be contained in any of the components 402–410 and may also be included as a stand alone component coupled to the bus 406.

Even though various aspects and advantages of the present invention have been set forth in the foregoing description, the above disclosure is illustrative only, and changes may be made in detail and yet remain within the broad principles of the present invention. Therefore, the present invention is to be limited only by the appended claims.

What is claimed is:

1. A single event upset immune device, comprising:
a first keeper circuit including a first precharge node adapted to receive a first precharge signal, a first output node, and a first control node, the first keeper circuit operable to develop a first data output signal on the output node responsive to the precharge signal applied to the first precharge node and operable during a precharge mode to maintain the precharge node at a first voltage level responsive to a first control signal applied to the control node, and the first keeper circuit further operable during an evaluation mode to drive the precharge node to either the first voltage level or a second voltage level responsive to a data input signal; and,
a second keeper circuit including a second precharge node adapted to receive a second precharge signal, a second output node coupled to the first control node, and a second control node coupled to the first output node, the second keeper circuit operable to develop a second data output signal on the second output node responsive to the second precharge signal, the second data output signal being applied as the first control signal to the first control node, and the second keeper circuit operable during the precharge mode to maintain the second precharge node at the first voltage level responsive to the first data output signal on the first output node, and the second keeper circuit further operable during the evaluation mode to drive the second precharge node to the same first or second voltage level as the first precharge node responsive to a second data input signal.

2. The single event upset immune device of claim 1 wherein each of the first and second keeper circuits comprises:
an inverting circuit having an input coupled to the corresponding precharge node and an output coupled to the corresponding output node, the inverting circuit operable to develop drive a signal on the output node to a voltage level corresponding to a complementary logic state of a signal on the precharge node; and
a switching circuit having a first signal terminal adapted to receive a supply voltage and a second signal terminal coupled to the corresponding precharge node, and a control terminal coupled to the output node of the other keeper circuit, the switching circuit operable to drive the precharge node to the supply voltage responsive to the signal on the output node of the other keeper circuit.

3. The single event upset immune device of claim 2 wherein the inverting circuit comprises an inverter and wherein the switching circuit comprises a PMOS transistor.

4. The single event upset immune device of claim 1 wherein each of the first and second keeper circuits comprises:
a logic circuit having a first input coupled to the corresponding precharge node, a second input adapted to receive a clock signal, and an output coupled to the corresponding output node, the logic circuit operable to develop a signal on the output node responsive to a signal on the precharge node when the clock signal is active; and
a switching circuit having a first signal terminal adapted to receive a supply voltage and a second signal terminal coupled to the corresponding precharge node, and a control terminal coupled to the output node of the other keeper circuit, the switching circuit operable to drive the precharge node to the supply voltage responsive to the signal on the output node of the other keeper circuit.

5. The single event upset immune device of claim 4 wherein the logic circuit comprises a NAND gate and wherein the switching circuit comprises a PMOS transistor.

6. The single event upset immune device of claim 1 wherein the first voltage level comprises a high voltage level.

7. The single event upset immune device of claim 1 further comprising:
- a first driver circuit coupled to the first precharge node and adapted to receive the first data input signal and a clocking signal, the first driver circuit operable to precharge the first precharge node to a voltage level responsive to the clocking signal and operable to drive the first precharge node to a voltage level responsive to the first data input signal; and
- a second driver circuit coupled to the second precharge node and adapted to receive the second data input signal and the clocking signal, the second driver circuit operable to precharge the second precharge node to a voltage level responsive to the clocking signal and operable to drive the second precharge node to a voltage level responsive to the second data input signal.

8. The single event upset immune device of claim 7 wherein each driver circuit comprises:
- a first switching device coupled between a first supply voltage source and the corresponding precharge node, the switching device being coupled to receive the clocking signal and being operable to couple the node to the first supply voltage source responsive to the clocking signal being active and to isolate the supply voltage source from the node responsive to the clocking signal being inactive; and
- a second switching device coupled between a reference voltage source and the corresponding precharge node and being coupled to receive the corresponding data input signal, the second switching device being operable to couple the node to the reference supply voltage source responsive to the data input signal having a first logic state and to isolate the node from the reference voltage source responsive to the data input signal having a second logic state.

9. The single event upset immune device of claim 8 wherein each first switching device comprises a PMOS transistor and wherein each second switching device comprises a plurality of N-channel transistors coupled in parallel.

10. The single event upset immune device of claim 1 wherein each of the first and second keeper circuits comprises:
- a first switching circuit coupled between a supply voltage source and the first precharge node and having a control terminal coupled to a first node;
- a second switching circuit coupled between the supply voltage source and the second precharge node and having a control terminal coupled to the first node;
- a third switching circuit coupled between the first node and the supply voltage source and a control terminal coupled to the first precharge node;
- a fourth switching circuit coupled between the first node and the supply voltage source and a control terminal adapted to receive a clock signal;
- a fifth switching circuit coupled to the first node and having a control terminal adapted to receive the clock signal;
- a sixth switching circuit coupled between the fifth switching circuit and a reference voltage source and having a control terminal coupled to the second precharge node.

11. The single event upset immune device of claim 10 wherein the first, second, third and fourth switching devices each comprises a PMOS transistor and wherein the fifth and sixth switching devices each comprises an NMOS transistor.

12. A processor, comprising:
- a data bus;
- a central processing unit coupled to the data bus;
- a memory coupled to the data bus; and
- a single event upset immune device coupled to at least one of the memory and the central processing unit, the device including,
  - a first keeper circuit including a first precharge node adapted to receive a first precharge signal, a first output node, and a first control node, the first keeper circuit operable to develop a first data output signal on the output node responsive to the precharge signal applied to the first precharge node and operable during a precharge mode to maintain the precharge node at a first voltage level responsive to a first control signal applied to the control node, and the first keener circuit further operable during an evaluation mode to drive the precharge node to either the first voltage level or a second voltage level responsive to a data input; and;
  - a second keeper circuit including a second precharge node adapted to receive a second precharge signal, a second output node coupled to the first control node, and a second control node coupled to the first output node, the second keeper circuit operable to develop a second data output signal on the second output node responsive to the second precharge signal, the second data output signal being applied as the first control signal to the first control node, and the second keeper operable during the precharge mode to maintain the second precharge node at the first voltage level responsive to the first data output signal on the first output node, and the second keeper circuit further operable during the evaluation mode to drive the second precharge node to the same first or second voltage level as the first precharge node responsive to a second data input.

13. The processor of claim 12 wherein the processor comprises a microprocessor.

14. The processor of claim 12 further comprising an electronic system including an input device and an output device coupled to the processor.

15. The processor of claim 12 wherein each of the first and second keeper circuits comprises:
- an inverting circuit having an input coupled to the corresponding precharge node and an output coupled to the corresponding output node, the inverting circuit operable to develop drive a signal on the output node to a voltage level corresponding to a complementary logic state of a signal on the precharge node; and
- a switching circuit having a first signal terminal adapted to receive a supply voltage and a second signal terminal coupled to the corresponding precharge node, and a control terminal coupled to the output node of the other keeper circuit, the switching circuit operable to drive the precharge node to the supply voltage responsive to the signal on the output node of the other keeper circuit.

16. The processor of claim 12 wherein each of the first and second keeper circuits comprises:
- a logic circuit having a first input coupled to the corresponding precharge node, a second input adapted to receive a clock signal, and an output coupled to the corresponding output node, the logic circuit operable to develop a signal on the output node responsive to a signal on the precharge node when the clock signal is active; and a switching circuit having a first signal terminal adapted to receive a supply voltage and a second signal terminal coupled to the corresponding precharge node, and a control terminal coupled to the output node of the other keeper circuit, the switching circuit operable to drive the precharge node to the supply voltage responsive to the signal on the output node of the other keeper circuit.

17. A method, comprising:

precharging a first dynamic node;

precharging a second dynamic node;

during a precharge mode of operation, maintaining a first logic state of a signal on the first dynamic node responsive to a second logic state of a signal on the second dynamic node; and maintaining the second logic state of the signal on the second dynamic node responsive to the first logic state of the signal on the first dynamic node; and during an evaluation mode of operation, driving the first dynamic node to either the first logic state or a second logic state responsive to a first data input signal;

driving the second dynamic node to the same logic state as the first dynamic node responsive to a second data input signal.

18. The method of claim 17 wherein the first and second logic states are the same logic state.

19. The method of claim 18 wherein the same logic state corresponds to a high logic state.

20. The method of claim 17 wherein each of the operations of maintaining comprises coupling a corresponding voltage source to the corresponding dynamic node.

* * * * *